United States Patent [19]

Yamazaki et al.

[11] Patent Number: 5,188,767
[45] Date of Patent: Feb. 23, 1993

[54] ELECTROCONDUCTIVE RESIN PASTE CONTAINING MIXED EPOXY RESIN AND ELECTROCONDUCTIVE METAL POWDER

[75] Inventors: Mitsuo Yamazaki, Hitachi; Nobuo Ichimura, Takahagi; Yasuo Miyamoto, Hitachi; Koei Fujita, Hitachi; Masao Kawasumi, Hitachi, all of Japan

[73] Assignee: Hitachi Chemical Co., Ltd., Tokyo, Japan

[21] Appl. No.: 686,674

[22] Filed: Apr. 17, 1991

[30] Foreign Application Priority Data

Apr. 27, 1990 [JP] Japan .................. 2-112131

[51] Int. Cl.$^5$ .............................. H01B 1/22
[52] U.S. Cl. .................... 252/512; 252/513; 252/514; 156/330; 523/427; 523/457; 524/94; 524/183
[58] Field of Search ............ 252/500, 511, 512, 513, 252/514, 515; 156/330; 523/427, 457; 524/94, 183

[56] References Cited

U.S. PATENT DOCUMENTS

| | | | |
|---|---|---|---|
| 3,859,379 | 1/1975 | Kitamura et al. | 525/486 |
| 3,909,480 | 9/1975 | Ogata et al. | 523/457 |
| 4,033,905 | 7/1977 | Bloom et al. | 252/500 |
| 4,732,702 | 3/1988 | Yamazaki et al. | 252/512 |
| 4,803,543 | 2/1989 | Inayoshi et al. | 156/330 |
| 4,903,119 | 2/1990 | Ito et al. | 174/52.2 |
| 5,010,143 | 4/1991 | Evans et al. | 525/394 |

FOREIGN PATENT DOCUMENTS 61-252224  10/1986  Japan .

*Primary Examiner*—A. Lionel Clingman
*Assistant Examiner*—Bradley A. Swope
*Attorney, Agent, or Firm*—Fay, Sharpe, Beall, Fagan, Minnich & McKee

[57] ABSTRACT

An electroconductive resin paste suitable for bonding a semiconductor element onto a substrate and exhibiting a superior adhesion strength and processability when heated to 200° C. to 350° C., and a process for producing a semiconductor device using the electroconductive resin paste are provided, which electroconductive resin paste comprises.

(A) a mixed epoxy resin of a phenolic novolac type epoxy resin with an epi-bis type epoxy resin,
(B) a phenolic novolac resin and/or phenol aralkyl resin,
(C) organic borate,
(D) a diluent containing a silane compound having one glycidyl group as at least one component therein, and
(E) an electroconductive metal powder.

9 Claims, No Drawings

ELECTROCONDUCTIVE RESIN PASTE CONTAINING MIXED EPOXY RESIN AND ELECTROCONDUCTIVE METAL POWDER

BACKGROUND OF THE INVENTION

Field of the Invention

This invention relates to an electroconductive resin paste. More particularly it relates to an electroconductive resin paste suitable for bonding a semiconductor element onto a supporting member therefor and a semiconductor device using the same.

Description of the Related Art

As a process for bonding a semiconductor element to a substrate therefor such as lead frame, etc., (1) Au-Si eutectic process, (2) soldering process, (3) resin paste process, etc. have so for been known. However, the process (1) has drawbacks that use of gold results in a high cost and also a processing temperature is as high as about 400° C. The process (2) is cheaper than the process (1), but has drawbacks that it is necessary to provide a thin coating of gold on the back surface of the semiconductor element, so that a cost is required for forming the thin coating. The process (3) uses a resin paste obtained by having silver powder as a filler, blended with a base resin such as an epoxy resin or a polyimide resin; hence the process has advantages that it is cheaper than the processes (1) and (2), and that it can be employed at a temperature of 200° C. or lower. Thus, at present, this resin paste process has been prevailing.

However, since conventional resin paste is required to be cured by heating in an oven at 150° C. to 200° C. for one to two hours, there has been a drawback that rationalization by making the semiconductor assembly steps in-line is difficult. Further, in the case where cure is effected within one minute, there have been problems that the shell stability life is short, the adhesion strength, particularly the hot adhesion strength at the time of heating the resins to 200° C. to 350° C. is low and a large number of voids occurs.

SUMMARY OF THE INVENTION

The object of the present invention is to provide an electroconductive resin paste having overcome the above-mentioned problems of the related art and affording a superior adhesion strength and processability when heated to 200° C. to 350° C.

The present invention resides in;

An electroconductive resin paste comprising (A) a mixed epoxy resin of a phenolic novolac type epoxy resin with an epi-bis type epoxy resin, (B) a phenolic novolac resin and/or phenol aralkyl resin, (C) an organic borate, (D) a diluent containing a silane compound having one glycidyl group as at least one component therein, and (E) an electroconductive metal powder.

DETAILED DESCRIPTION OF PREFERRED EMBODIMENTS

The mixed epoxy resin (A) used in the present invention is a mixture of a phenolic novolac type epoxy resin with an epi-bis type epoxy resin, and the mixing proportion by weight thereof (phenolic novolac type epoxy resin/epi-bis type epoxy resin) is preferably in the range of 20/80 to 95/5, in the aspects of heat resistance and adhesion strength.

The phenolic novolac type epoxy resin refers to a glycidyl ether of a phenolic novolac resin or a cresolic novolac resin. Its examples are DEN-438 (Tradename of Dow Chemical Co., Ltd.), YDCN 701 and 702 (tradename of Toto Kasei Co., Ltd.), etc.

The epi-bis type epoxy resin refers to a condensate of bisphenol A, bisphenol AD, bisphenol F, bisphenol S, alkylated bisphehol A or halogenated bisphenol A, with epichlorohydrin. Its examples are EP-828, EP-1001 and EP-1004 (each, tradename of Yuka-Shell epoxy Co., Ltd.), YDF-170 and YDB-340(each, tradename of Toto Kasei Co., Ltd.), and R-710 (tradename of Mitsui Petrochemical Co., Ltd.), etc.

The phenolic novolac resin (B) in the present invention is used as a main curing agent for epoxy resins. Its examples are H-1 (tradename, made by Meiwa Kasei Co., Ltd.), Hp-607N (tradename, made by Hitachi Kasei Co., Ltd.), etc.

The phenol-aralkyl resin (B) used in this invention is a resin obtained by polycondensing $\alpha,\alpha'$-dimethoxy-p-xylene and a phenolic monomer with a Friedel-Crafts catalyst. This resin is used as a curing agent for said epoxy-novolak resin. This type of resin is also commercially available under the trade names of, for example, XL-225 by Mitsui-Toatsu Chemicals Inc. and XYLOK-225 by Albright & Wilson Ltd. The phenolic novolac resin and/or phenol-aralkyl resin (B) is blended with the mixed epoxy resin (A) preferably at such an amount that the quantity of the hydroxyl group of the phenolic novolac resin and/or phenol-aralkyl resin (B) can fall within a range of 0.6 to 1.5 equivalent per equivalent of the epoxy group of the mixed epoxy resin (A), in the aspect of curing properties and characteristics of cured product.

The organic borate (C) in the present invention is used as a cure-accelerator. Its examples are tetraphenyl phosphonium tetraphenyl borate salt (made by Hokko Kagaku Co., Ltd.), 1,8-diazabicyclo(5, 4, 0)undecene-7 tetraphenyl borate salt (made by SAN-APRO Co., Ltd.), 2-ethyl-4-methylimidazole tetraphenyl borate salt (made by Hokko Kagaku Co., Ltd.), etc. The quantity of the tetraphenyl borate salt (C) blended is preferred to be 0.1 to 30 parts by weight per 100 parts by weight of the total quantity of the mixed epoxy resin (A) and the phenolic novolac resin and/or phenol aralkyl resin (B), in the aspects of curing properties and shell stability.

The diluent (D) used in the present invention contains a silane compound having one glycidyl group as at least one component thereof.

Examples of the silane compound are $\gamma$-glycidoxypropyltrimethoxysilane (KBM-403(tradename) made by Shinetsu Kagaku Co., Ltd.), $\gamma$-glycidoxypropylmethyldimetoxysilane (TSL-8355 (tradename) made by Toshiba Silicone Co., Ltd.), $\gamma$-glycidoxypropylpentamethyldisiloxane (TSL-9905(tradename) made by Toshiba Silicone Co., Ltd.), $\gamma$-glycidoxypropylmethyldiethoxysilane (made by Chisso Corporation), $\gamma$-glycidoxypropyldimethyletoxysilane (made by Chisso Corporation), ($\gamma$-glycidoxypropyl)-bis-(trimethylsiloxy)-methylsilane (made by Chisso Corporation), etc. Its content is preferred to be 20 to 100% by weight based on the total quantity of the diluent (D), in the aspect of adhesion strength.

As diluents other than the silane compound, organic solvents having a boiling point of 100° C. or higher such as ethylene glycol monoethyl ether, ethylene glycol monobutyl ether, ethylene glycol monoethyl ether acetate, ethylene glycol monobutyl ether acetate, diethylene glycol monoethyl ether, diethylene glycol monoethyl ether acetate, diethylene glycol monobutyl ether, diethylene glycol monobutyl ether acetate, α-terpineol, etc., reactive diluents having 1 to 2 epoxy groups in one molecule such as phenylglycidylether, cresylglycidylether, p-(t-butyl)phenylglycidylether, p-(sec-butyl)phenylglycidylether, butanedioldiglycidylether, for example, may be used.

The diluent (D) is used for adjusting the viscosity and improving the processability of the electroconductive resin paste. Further, the diluent can afford a coupling effect in the case where it is used together with the above silane compound and also can improve the hot adhesion strength of the cured product of the electroconductive resin paste at 200° C. to 350° C. The quantity of these diluents blended is preferred to be 5 to 800 parts by weight based upon the total 100 parts by weight of the mixed epoxy resin (A) and the phenolic novolac resin and/or phenol-aralkyl resin (B), in the aspects of the processability and the stability of the electroconductive resin paste.

The electroconductive metal powder (E) used in the present invention affords an electroconductivity to the electroconductive resin paste, and an electroconductive powder such as those of silver, gold, copper, nickel, iron, stainless steel, etc. is used. Examples of the powder are silver powder (TCG-1(tradename) made by Tokuriki Kagaku Co., Ltd.), gold powder (TA-I(tradename) made by Tokuriki Kagaku Co., Ltd.), copper powder (CE-115(tradename) made by Fukuda Metal Foil Powder Co., Ltd.), nickel powder (Type-123(tradename) made by Inco Co., Ltd.), iron powder (Fe-S-100(tradename) made by Fukuda Metal Foil Powder Co., Ltd.), and stainless steel powder (SUS 304L(tradename) made by Fukuda Metal Foil Powder Co., Ltd.). Among these, silver powder is preferred in the aspects of oxidation-resistance and electroconductivity. The quantity of the electroconductive metal powder (E) blended is preferred to be in the range of 100 to 1,000 parts by weight based upon the total quantity 100 parts by weight of the mixed epoxy resin (A) and the phenolic novolac resin and/or phenol-aralkyl resin (B).

To the electroconductive resin paste of the present invention may be added an adhesion-improving agent such as silane coupling agent, titanium coupling agent, etc., a wetting-improving agent such as nonionic surfactant, fluorine compound surfactant, a silicone oil, etc.

The electroconductive resin paste of the present invention may be prepared by mixing the respective definite quantities of a phenolic novolac type epoxy resin, an epi-bis type epoxy resin and a phenolic novolac resin and/or phenolaralkyl resin, at a time or dividedly, with a definite quantity of a diluent, with stirring on heating to dissolve them, if necessary, to obtain a resulting varnish, followed by adding to a definite quantity of the resulting varnish a cure-accelerator, a diluent, an electroconductive metal powder and if necessary, additives such as coupling agent, etc., at a time or dividedly, and kneading or dissolving the resulting mixture by means of a combination of stirrer, mixing and grinding machine, three-roll mill, ball mill and the like.

Using the electroconductive resin paste of the present invention, a semiconductor element is bonded onto a supporting member to prepare a semiconductor device.

For example, the electroconductive resin paste of the present invention is applied onto a substrate, followed by placing a semiconductor element thereon, contacting and bonding the resulting laminate and curing the paste on heating to bond the semiconductor element onto the substrate, thereby obtaining a semiconductor device.

The electroconductive resin paste of the present invention is suitable as a bonding material for bonding of semiconductor element such as Integrated Circuit (IC), LSI circuit, etc., onto a substrate such as lead frame, ceramic wiring-board, glass epoxy wiring-board, etc., or for bonding of tantalum condenser chip, etc. onto lead frame.

The present invention will be described in more detail by way of Examples, but it should not be construed to be limited thereto.

EXAMPLES 1-9 AND COMPARATIVE EXAMPLES 1-4

DEN-438, EP-1001, H-1, XL-225, KBM-403 and ethylene glycol monobuthyl ether having proportions indicated in Table 1, respectively, were mixed and dissolved on heating at 100° C. to prepare a varnish, followed by kneading this varnish and TCG-1 by means of a mixing and grinding machine to produce an electroconductive resin paste and measuring its characteristics according to the following methods.

(1) Viscosity of the electroconductive resin paste

The viscosity was measured at 25° C. using a rotational viscometer of EHD type (tradename, made by Tokyo Keiki Co., Ltd.), (2) Adhesion strength The resulting electroconductive resin paste was applied onto a silver-plated copper lead frame, followed by placing a silicon chip of 2mm×2mm on the lead frame, bonding them to obtain a bonded material, curing it while allowing it to stand on a heating block at 250° C. for 30 seconds, and measuring the shearing adhesion strength of the cured sample at room temperature and its hot shearing adhesion strength at 350° C., by means of a push-pull gauge made by Aiko Engineering Co., Ltd.

(3) Viscosity stability

The electroconductive resin paste was allowed to stand at 25° C. for 10 days, followed by measuring the resulting viscosity. When the viscosity was within a range of 0.8 to 1.2 times the original viscosity, it was expressed by a symbol ○, and when it was outside the range, it was expressed by a symbol X.

Further, the row materials used and listed in Table 1 were as follows:

DEN-438: tradename of phenolic novolac resin type epoxy resin (made by Dow Chemical Co., Ltd. epoxy equivalent=200).

EP-1001: tradename of epi-bis type epoxy resin (made by Yuka-Shell Epoxy Co., Ltd., epoxy equivalent=450).

H-1: tradename of phenolic novolac resin (made by Meiwa Kasei Co., Ltd., hydroxyl group equivalent=106).

XL-225: tradename of phenol aralkyl resin (made by MITSUI-TOATSU Chemicals Inc., hydroxyl group equivalent=185).

KBM-403: diluent, tradename of γ-glycidoxypropyltrimethoxysilane (made by Shinetsu Kagaku Co., Ltd.).

Ethylene glycol monobutyl ether: diluent, guaranteed reagent (made by Kanto Kagaku Co., Ltd.).

TCG-1: tradename of electroconductive metal powder (made by Tokuriki Kagaku Co., Ltd., flaky silver powder).

TPP.TPB: cure-accelerator, tetraphenyl phosphonium tetraphenyl borate salt (made by Hokko Kagaku Co., Ltd.).

2E4MZ TPB: cure-accelerator, 2-ethyl-4-methylimidazole. tetraphenyl borate salt (made by Hokko Kagaku Co., Ltd.).

DBU TPB: cure-accelerator, 1,8-diazabicyclo(5,4,0)-undecene-7 tetraphenyl borate salt (made by SAN-APRO Co., Ltd.).

2PZ-OK: cure-accelerator, tradename of 2-phenylimidazole isocyanuric acid adduct (made by Shikoku Kasei Co., Ltd.). The results are shown in Table 1.

to make a bonding process in-line and to reduce the cost of semiconductor device to a large extent.

What we claim is:

1. An electroconductive resin paste comprising
   (A) a mixture of a phenolic novolac epoxy resin and an epi-bis epoxy resin,
   (B) a phenolic novolac resin and/or phenol aralkyl resin,
   (C) tetraphenylborate,
   (D) a diluent containing a silane compound having one glycidyl group as at least one component therein, the silane compound in a range of 20–100% by weight based on the total quantity of diluent, and
   (E) an electroconductive metal powder, wherein the quantity of said diluent (D) blended is in the range

TABLE 1

| | | Example 1 | Example 2 | Example 3 | Example 4 | Example 5 | Example 6 | Example 7 |
|---|---|---|---|---|---|---|---|---|
| Blending (parts by weight) | DEN-438 | 70 | 50 | 30 | 50 | 50 | 50 | 50 |
| | Ep-1001 | 30 | 50 | 50 | 50 | 50 | 50 | 50 |
| | H-1 | 44 | 38 | 28 | 38 | 38 | 38 | 38 |
| | XL-225 | — | — | — | — | — | — | — |
| | KBM-403 | 130 | 130 | 120 | 130 | 130 | 20 | 60 |
| | Ethylene glycol monobutyl ether | — | — | — | — | — | 110 | 70 |
| | TPP.TPB | 5 | 5 | 5 | — | — | 5 | 5 |
| | 2E4MZ.TPB | — | — | — | 3 | — | — | — |
| | DBU.TPB | — | — | — | — | 5 | — | — |
| | 2PZ-OK | — | — | — | — | — | — | — |
| | TCG-1 | 520 | 500 | 460 | 500 | 500 | 500 | 500 |
| Characteristics | Viscosity (poise) | 950 | 900 | 950 | 900 | 900 | 820 | 850 |
| | Adhesion strength (kg/chip) Room temp. | 4.4 | 4.9 | 4.0 | 4.5 | 4.6 | 2.7 | 3.5 |
| | 350° C. | 0.9 | 0.9 | 0.6 | 1.1 | 1.0 | 0.7 | 1.0 |
| | Viscosity stability | o | o | o | o | o | o | o |

| | | Example 8 | Example 9 | Comp. ex. 1 | Comp. ex. 2 | Comp. ex. 3 | Comp. ex 4 |
|---|---|---|---|---|---|---|---|
| Blending (parts by weight) | DEN-438 | 50 | 50 | 100 | — | 50 | 50 |
| | Ep-1001 | 50 | 50 | — | 100 | 50 | 50 |
| | H-1 | 38 | — | 53 | 24 | 38 | 38 |
| | XL-225 | — | 67 | — | — | — | — |
| | KBM-403 | 90 | 60 | 140 | 113 | — | 130 |
| | Ethylene glycol monobutyl ether | 40 | 100 | — | — | 130 | — |
| | TPP.TPB | 5 | 5 | 5 | 5 | 5 | — |
| | 2E4MZ.TPB | — | — | — | — | — | — |
| | DBU.TPB | — | — | — | — | — | — |
| | 2PZ-OK | — | — | — | — | — | 1 |
| | TCG-1 | 500 | 600 | 550 | 446 | 500 | 500 |
| Characteristics | Viscosity (poise) | 900 | 700 | 1000 | 900 | 800 | 800 |
| | Adhesion strength (kg/chip) Room temp. | 4.0 | 4.0 | 3.6 | 3.5 | 1.5 | 4.5 |
| | 350° C. | 0.9 | 0.8 | 0.6 | 0.4 | 0.3 | 1.0 |
| | Viscosity stability | o | o | o | o | o | x |

As apparent from Table 1, in the cases of Examples 1–3 where a phenolic novolac type epoxy resin is simultaneously used with an epi-bis type epoxy resin, the adhesion strengths are higher than in the case of comparative examples 1 and 2 where these epoxy resins are singly used, respectively, and in the case of Comparative example 3 where no compound having one glycidyl group (KBM-403) is used, the adhesion strength at 350° C. is lower, and also in the case of Comparative 4 where an imidazole is used as a cure-accelerator, a tolerable adhesion strength is obtained, but the viscosity stability is deficient.

According to the electroconductive resin paste of the present invention, it is possible to bond a semiconductor element such as IC, LSI circuit, etc. onto a substrate such as lead frame, ceramic wiring-board, glass epoxy substrate, etc., in a short time without lowering the adhesion strength at 200° C.–350° C.; hence it is possible of 5 to 800 parts by weight and the quantity of said electroconductive metal powder (E) blended is in the range of 100 to 1,000 parts by weight based upon the total 100 parts by weight of the mixture of (A) and the phenolic novolac resin and/or phenol aralkyl resin (B).

2. An electroconductive resin paste according to claim 1, wherein the mixing proportion by weight of a phenolic novolac epoxy resin with an epi-bis epoxy resin (a phenolic novolac epoxy resin/an epi-bis epoxy resin) in the mixture of (A) is in the range of 20/80 to 95/5.

3. An electroconductive resin paste according to claim 1, wherein the phenolic novolac epoxy resin is a glycidyl ether of a phenolic novolac resin or a cresolic novolac resin.

4. An electroconductive resin paste according to claim 1, wherein the epi-bis epoxy resin is a condensate of a member selected from the group consisting of bisphenol A, bisphenol AD, bisphenol F, bisphenol S, alkylated bisphenol A and hologenated bisphenol A, with epichlorohydrin.

5. An electroconductive resin paste according to claim 1, wherein the phenolic novolac resin and/or phenol aralkyl resin (B) is blended with the mixture of (A) at such an amount that the quantity of the hydroxyl group of the phenolic novolac resin and/or phenol aralkyl resin (B) can fall within a range of 0.6 to 1.5 equivalent per equivalent of the epoxy group of the mixture of (A).

6. An electroconductive resin paste according to claim 1, wherein said tetraphenylborate is selected from the group consisting of tetraphenyl phosphonium tetraphenyl borate salt, 1,8-diazabicyclo(5,4,0)undecene-7 tetraphenyl borate salt, and 2-ethyl-4-methylimidazole tetraphenyl borate salt.

7. An electroconductive resin paste according to claim 1, wherein the quantity of the tetraphenylborate (C) blended is in the range of 0.1 to 30 parts by weight per 100 parts by weight of the total quantity of the mixed epoxy resin (A) and the phenolic novolac resin and/or phenol aralkyl resin (B).

8. An electroconductive resin paste according to claim 1, wherein said silane compound is selected from the group consisting of $\gamma$-glycidoxypropyltrimethoxysilane, $\gamma$-glycidoxypropylmethyldimethoxysilane, $\gamma$-glycidoxypropylpentamethyldisiloxane, $\gamma$-glycidoxypropylmethyldiethoxysilane, $\gamma$-glycidoxypropyldimethylethoxysilane and ($\gamma$-glycidoxypropyl)-bis-(trimethylsiloxy)-methysilane.

9. An electroconductive resin paste according to claim 1, wherein said electroconductive metal powder (E) is silver powder.

* * * * *